US012765129B2

(12) United States Patent
Wu et al.

(10) Patent No.: US 12,765,129 B2
(45) Date of Patent: Oct. 13, 2026

(54) LIGHT-EMITTING DIODE CURRENT STEERING DEVICE

(71) Applicant: Taiwan-Asia Semiconductor Corporation, Hsinchu City (TW)

(72) Inventors: Kuo-Chen Wu, Hsinchu City (TW); Ching-Shih Ma, Hsinchu City (TW)

(73) Assignee: Taiwan-Asia Semiconductor Corporation, Hsinchu City (TW)

( * ) Notice: Subject to any disclaimer, the term of this patent is extended or adjusted under 35 U.S.C. 154(b) by 370 days.

(21) Appl. No.: 18/532,658

(22) Filed: Dec. 7, 2023

(65) Prior Publication Data

US 2024/0213410 A1 Jun. 27, 2024

(30) Foreign Application Priority Data

Dec. 25, 2022 (TW) .................................. 111149854

(51) Int. Cl.

| | |
|---|---|
| ***H01L 33/38*** | (2010.01) |
| ***H01L 33/22*** | (2010.01) |
| ***H01L 33/42*** | (2010.01) |
| ***H10H 20/82*** | (2025.01) |
| ***H10H 20/831*** | (2025.01) |
| ***H10H 20/833*** | (2025.01) |

(52) U.S. Cl.
CPC ........ *H10H 20/8312* (2025.01); *H10H 20/82* (2025.01); *H10H 20/833* (2025.01)

(58) Field of Classification Search
CPC ... H10H 20/8312; H10H 20/833; H10H 20/82
See application file for complete search history.

(56) References Cited

U.S. PATENT DOCUMENTS 6,445,007 B1 * 9/2002 Wu .................... H10H 20/8314 257/90
6,885,036 B2 * 4/2005 Tarsa .................. H10H 20/819 257/E33.07
(Continued)

FOREIGN PATENT DOCUMENTS

CN 101517758 A 8/2009
CN 106559638 A 4/2017
(Continued)

*Primary Examiner* — Peniel M Gumedzoe
(74) *Attorney, Agent, or Firm* — MUNCY, GEISSLER, OLDS & LOWE, P.C.

(57) ABSTRACT

A light-emitting diode current steering device for enhancing the light extraction efficiency of the light-emitting diode and improving current-steering includes a contact electrode; a substrate connected to the contact electrode; a first electrode connected to the substrate; a first semiconductor layer electrically connected to the first electrode; the light-emitting layer electrically connected to the first semiconductor layer; the second semiconductor layer electrically connected to the light-emitting layer; the second electrode having a main electrode and a plurality of extension electrodes; a current steering layer disposed between one side of the second semiconductor layer and one side of the second electrode and having a main semiconductor layer and an etched region etched with the second electrode as a pattern reference to increase the resistance by etching so that the current flows in the direction toward the main semiconductor layer to achieve a steering effect.

11 Claims, 3 Drawing Sheets

(56) References Cited

U.S. PATENT DOCUMENTS

| | | | | |
|---|---|---|---|---|
| 2005/0285136 | A1* | 12/2005 | Ou | H10H 20/82 257/E33.068 |
| 2008/0035935 | A1 | 2/2008 | Shum | |
| 2008/0296598 | A1 | 12/2008 | Wang et al. | |
| 2008/0315241 | A1 | 12/2008 | Shum | |
| 2010/0052000 | A1* | 3/2010 | Ko | H10H 20/816 257/98 |
| 2010/0052003 | A1 | 3/2010 | Shum | |
| 2015/0028379 | A1 | 1/2015 | Chen | |
| 2015/0333228 | A1 | 11/2015 | Song et al. | |

FOREIGN PATENT DOCUMENTS

| | | | |
|---|---|---|---|
| TW | 201013971 | A | 4/2010 |
| TW | I338387 | B | 3/2011 |
| TW | 201429001 | A | 7/2014 |
| TW | 201505209 | A | 2/2015 |

* cited by examiner

LIGHT-EMITTING DIODE CURRENT STEERING DEVICE

CROSS-REFERENCES TO RELATED APPLICATIONS

This application claims priority to Taiwan Patent Application No. 111149854 filed on Dec. 25, 2022, which is hereby incorporated by reference in its entirety.

BACKGROUND OF THE INVENTION

Field of the Invention

The present invention relates to light-emitting diode current-steering in the field of optoelectronics, particularly a light-emitting diode current-steering device that improves light extraction efficiency and current-steering.

Descriptions of the Related Art

Traditionally, on the upper light-emitting surface, it mostly only uses the finger to guide the current flow, or uses oxide insulators below the electrodes to expand the current outward. However, the prior art requires additional process for the structure and has problems of non-uniform current distribution and unintended current flow.

The Taiwan patent No. TWI338387B discloses a light-emitting diode device, which includes an epitaxial stacked layer and a current spreading layer. The epitaxial stacked layer has a first semiconductor layer, a light-emitting layer and a second semiconductor layer in sequence. The current spreading layer is disposed on the first semiconductor layer of the epitaxial stacked layer, and the current spreading layer has a micro/nano roughening structure layer and a transparent conductive layer. The micro/nano roughening structure layer has a plurality of voids. The transparent conductive layer covers the surface of the micro/nano roughening structure layer and the voids. In addition, the previous patent also discloses a manufacturing method of a light-emitting diode device and a current spreading layer with a micro/nano structure. This patent uses additional materials (nanoballs) and processes (nanoimprinting) to achieve the effect of current-steering, but it has shortcomings such as a complicated process and easily non-uniform product appearance.

The China invention patent publication No. CN106558638A discloses an LED chip with high light-emitting efficiency and the manufacturing method thereof. The LED chip includes a substrate, on which a buffer layer, an N-type (P-type) semiconductor layer, a light-emitting layer, a P-type (N-type) semiconductor layer, a current blocking layer and a transparent conductive film are formed in sequence from bottom to top. The transparent conductive film is divided into n layers. The P(N) electrode is formed on the uppermost transparent conductive film. The periphery of the P(N)-type semiconductor layer is etched into the N(P)-type semiconductor layer to form a closed step, and the N(P) electrode is formed on the closed step in each direction. This patent application effectively improves the problem of excessive local current, improves the uniformity of current distribution, and thereby improves light-emitting efficiency. However, it requires an additional layer of insulating current blocking layer, which causes additional processes and reduces the original brightness.

Given this, the present invention provides a light-emitting diode current-steering device, which solves the deficiencies of the conventional "current-steering device" in the prior art. The present invention etches away the original epitaxial structure to cause most currents to be unable to effectively flow downward so as to achieve the function of current spreading to the sides, thereby making the current distribution uniform and improving the brightness to solve the problems of non-uniform current distribution and unexpected flow directions.

SUMMARY OF THE INVENTION

The first objective of the present invention is to provide a light-emitting diode current-steering device which is used to enhance the light extraction efficiency of a light-emitting diode and to improve the current-steering.

In order to achieve the above objective or other objectives, the present invention provides a light-emitting diode current-steering device for enhancing the light extraction efficiency of the light-emitting diode and improving the current-steering, which includes: a contact electrode; a substrate connected to the contact electrode; a first electrode connected to the substrate; a first semiconductor layer electrically connected to the first electrode; the light-emitting layer electrically connected to the first semiconductor layer; the second semiconductor layer electrically connected to the light-emitting layer; the second electrode having a main electrode and a plurality of extension electrodes; a current steering layer disposed between one side of the second semiconductor layer and one side of the second electrode and having a main semiconductor layer and an etched region formed by being etched with the second the electrode as a pattern reference to increase the resistance by etching so that the current flows in the direction toward the main semiconductor layer to achieve the steering effect.

Furthermore, the contact electrode is composed of a combination of titanium/gold or nickel/gold.

Furthermore, the first semiconductor layer is a P-type epitaxial layer or an N-type epitaxial layer.

Furthermore, the second semiconductor layer is a P-type epitaxial layer or an N-type epitaxial layer.

Furthermore, the first semiconductor layer is exposed to the second semiconductor layer and the light-emitting layer.

Furthermore, a roughening process is performed on the main semiconductor layer to improve the light extraction efficiency.

Furthermore, the main semiconductor layer is a P-type epitaxial layer or an N-type epitaxial layer and has a thickness thinner than the other semiconductor layers.

Furthermore, a transparent electrode is further included between the first electrode and the substrate, and the transparent electrode is a conductive oxide.

Furthermore, a metal layer is further optionally included between the first electrode and the substrate and is disposed on one side of the transparent electrode, and the metal layer is composed of titanium, gold, nickel or platinum.

Furthermore, the second electrode is composed of germanium, titanium, nickel, platinum, gold or chromium.

Furthermore, the main electrode, the extension electrode or a combination thereof is selectively used as a reference for the etched region to determine a position of the etched region.

Furthermore, when the main electrode and the extension electrode are used as the reference for the position of the etched region, a connection position between the main electrode and the extension electrode is not etched to achieve an improved steering effect.

Compared with the prior art, the present invention provides a light-emitting diode current-steering device, which etches the light-shielding region to perform current-steering so that the electricity flows toward the unshielded region to enhance the light extraction efficiency of the light-emitting diode. As a result, the process is simple and time-consuming and only requires one additional yellowing and one additional etching process.

BRIEF DESCRIPTION OF THE DRAWINGS

FIG. 2(*b*) is a schematic view of the etching portion of the main electrode according to the second embodiment of the present invention.

FIG. 2(*c*) is a schematic view of the etched portion of the extension electrode according to the second embodiment of the present invention.

FIG. 3(*b*) is a schematic view of the etching portion of the combination of the main electrode and the extension electrode according to the third embodiment of the present invention.

DETAILED DESCRIPTION OF THE PREFERRED EMBODIMENT

In order to fully understand the objectives, features and effects of the present invention, the present invention will be described in detail through the following specific embodiments and accompanying drawings as follows.

In the present invention, "a" or "an" is used to describe one or more units, devices and components described herein. Such a descriptive term is merely for the convenience of illustration and to provide a general sense of the scope of the present invention. Therefore, unless expressly stated otherwise, the term "a" or "an" is to be understood to include one or at least one, and the singular form also includes the plural form.

As used herein, the term "comprise" "include," "have," "contain" or any other similar term is not intended to exclude additional, unrecited elements. For example, a device, structure, article, or apparatus that contains a plurality of elements is not limited to those elements listed herein, but may include other elements that are not explicitly listed but are generally inherent in the device, structure, article, or apparatus. In addition, unless expressly stated to the contrary, the term "or" is meant to be an inclusive "or" and not an exclusive "or."

Figure 1:
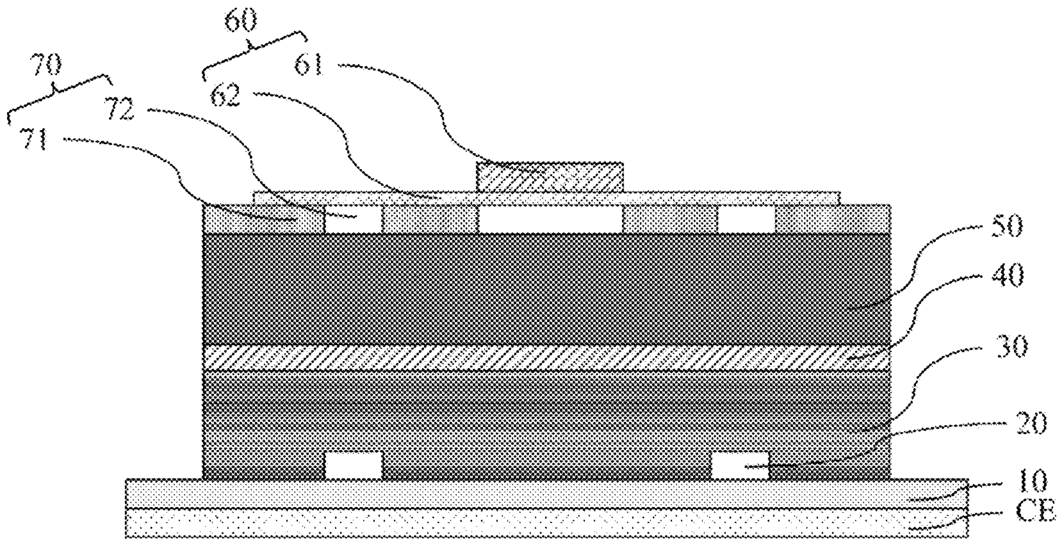
FIG. 1 is a layered structure diagram of the light-emitting diode current-steering device according to the first embodiment of the present invention.

Please refer to FIG. 1, which is a layered structure diagram of a light-emitting diode current-steering device according to a first embodiment of the present invention. The present invention provides a light-emitting diode current steering device for enhancing the light extraction efficiency of a light-emitting diode and for improving the current-steering, including: a contact electrode CE; a substrate 10 connected to the contact electrode CE; a first electrode 20 connected to the substrate 10; a first semiconductor layer 30 electrically connected to the first electrode 20; a light-emitting layer 40 electrically connected to the first semiconductor layer 30; a second semiconductor layer 50 electrically connected to the light-emitting layer 40; a second electrode 60 having a main electrode 61 and a plurality of extension electrodes 62; and a current-steering layer 70 disposed between one side of the second semiconductor layer 50 and one side of the second electrode 60. The current-steering layer 70 has a main semiconductor layer 71 and an etched region 72. The etched region 72 is etched with the second electrode 60 as a pattern reference and etched at different positions as required. By etching the current-steering layer 70, the contact resistance between a part of the main electrode 61 and a part of the extension electrodes 62 and the second semiconductor layer 50 is increased, and the current is allowed to flow in the direction toward the main semiconductor layer 71 to achieve steering effect.

The contact electrode CE is composed of a combination of titanium/gold or nickel/gold. The first semiconductor layer 30 is a P-type epitaxial layer or an N-type epitaxial layer. The second semiconductor layer 50 is a P-type epitaxial layer or an N-type epitaxial layer. The first semiconductor layer 30 is exposed to the second semiconductor layer 50 and the light-emitting layer 40. The main semiconductor layer 71 is a P-type epitaxial layer or an N-type epitaxial layer and has a thickness thinner than the other semiconductor layers. A roughening process is performed on the main semiconductor layer 71 to improve the light extraction efficiency. A transparent electrode is further included between the first electrode 20 and the substrate 10. The transparent electrode is a conductive oxide, e.g., ITO (indium tin oxide), IZO (indium zinc oxide), IGZO (indium gallium zinc oxide), ZnO (zinc oxide), AZO (aluminum zinc oxide), etc. A metal layer is further optionally included between the first electrode 20 and the substrate 10 and is disposed on one side of the transparent electrode. The material of the metal layer may be composed of at least one material, such as titanium (Ti), gold (Au), nickel (Ni) or platinum (Pt). The second electrode 60 may be composed of at least one material such as germanium (Ge), titanium (Ti), nickel (Ni), platinum (Pt), gold (Au) or chromium (Cr).

Figure 2A:
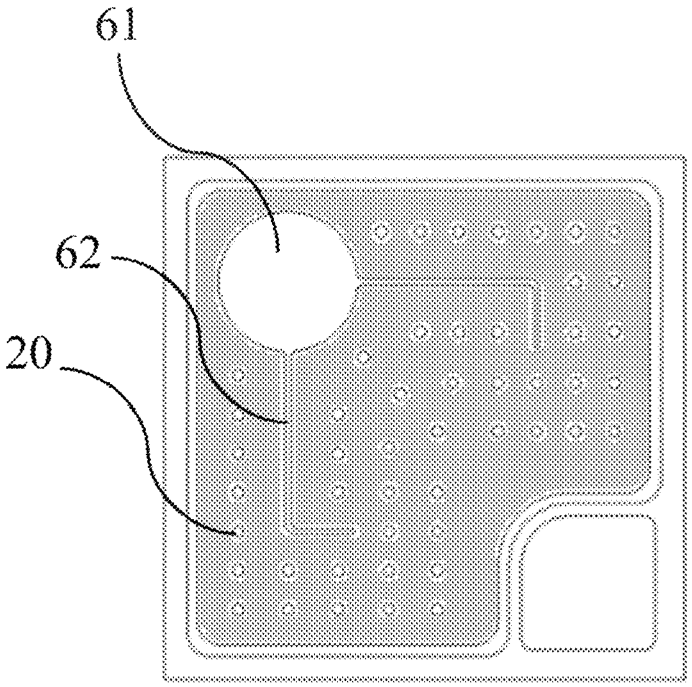
FIG. 2(*a*) is a top view of the light-emitting diode current-steering device according to the second embodiment of the present invention.
Figure 2B:
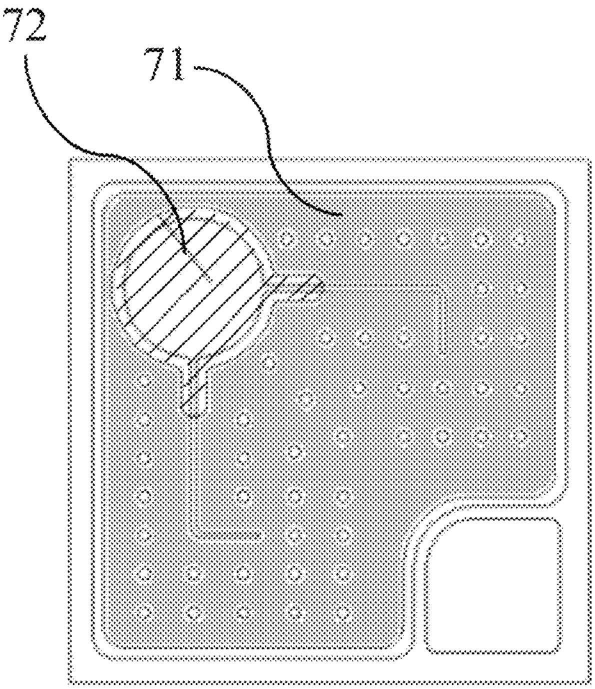
Figure 2C:
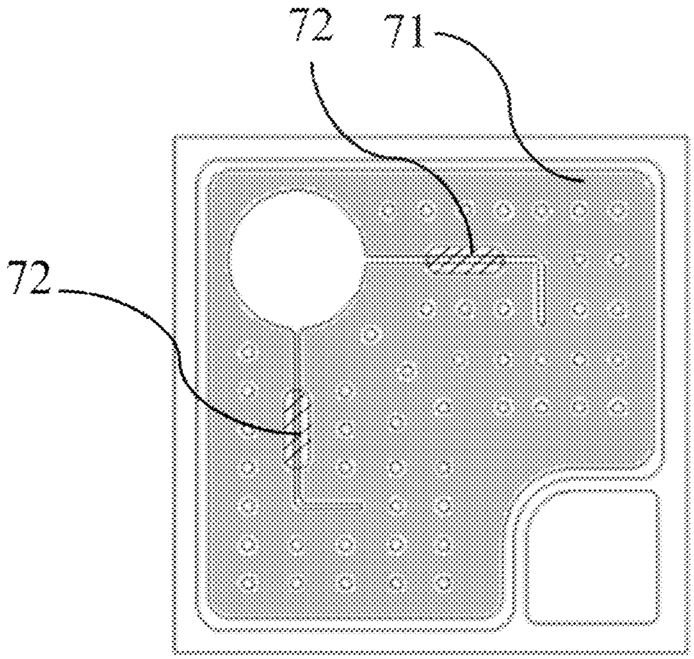

Reference is made to FIGS. 2(*a*)-2(*c*). Please refer to FIG. 2(*a*), which is a top view of the light-emitting diode current-steering device according to the second embodiment of the present invention. The main electrode 61, the extension electrode 62 or a combination thereof is selectively used as a reference for the etched region 72 to determine a position of the etched region 72 to reduce the light-blocking percentage by the second electrode 60. Please refer to FIG. 2(*b*), which is a schematic view of the etching portion of the main electrode according to the second embodiment of the present invention. The main electrode 61 is selected to use as a reference for the etched region 72 to determine a position of the etched region 72. Please further refer to FIG. 2(*c*), which is a schematic view of the etched portion of the extension electrode according to the second embodiment of the present invention. The extension electrode 62 is selected to use as a reference for the etched region 72 to determine a position of the etched region 72.

Figure 3A:
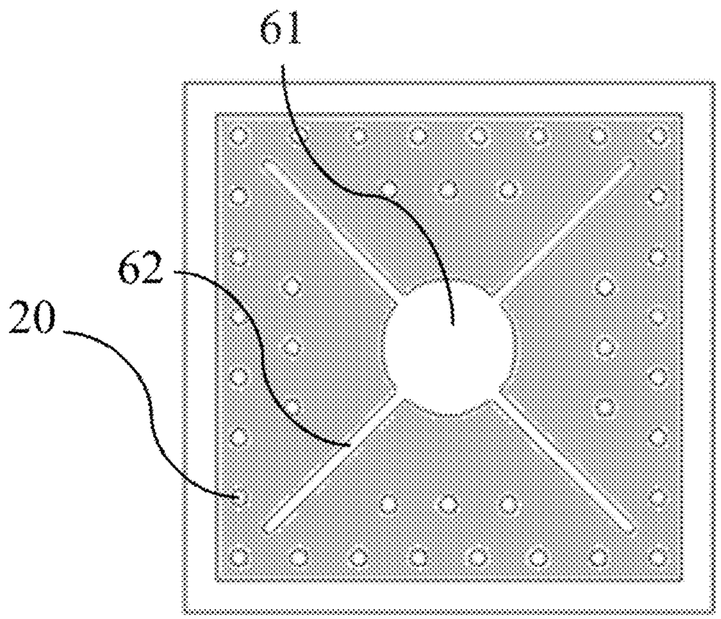
FIG. 3(*a*) is a top view of the light-emitting diode current-steering device according to the third embodiment of the present invention.
Figure 3B:
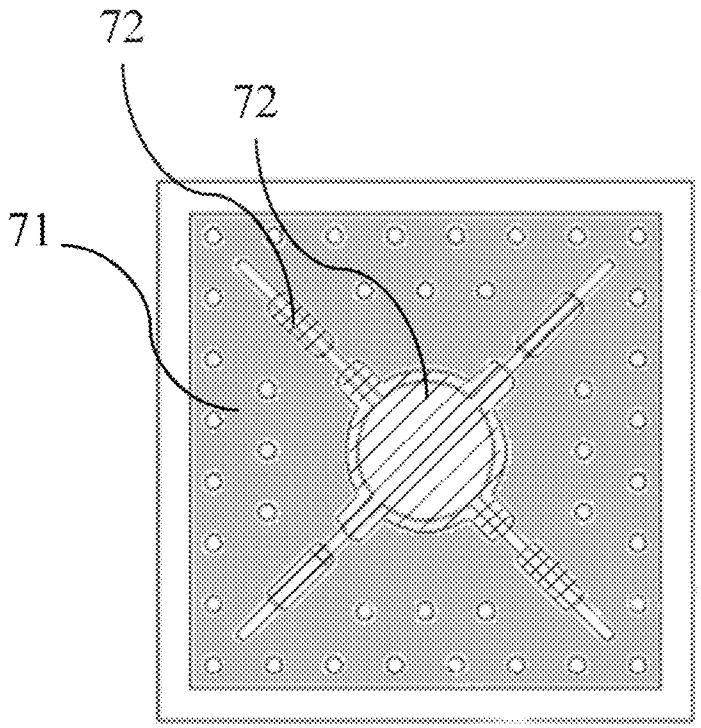

Reference is made to FIGS. 3(*a*) and 3(*b*). Please refer to FIG. 3(*a*), which is a top view of the light-emitting diode current-steering device according to the third embodiment of the present invention. The main electrode 61, the extension electrode 62 or a combination thereof is selectively used as a reference for the etched region 72 to determine a position of the etched region 72. Please refer to FIG. 3(*b*), which is a schematic view of the etching portion of the combination of the main electrode and the extension electrode according to the third embodiment of the present invention. The main electrode 61 and the extension electrode 62 are used as the reference for the position of the etched region 72. In this way, a connection position between the main electrode 61 and the extension electrode 62 is not etched to achieve an improved steering effect.

The present invention has been disclosed above by way of preferred embodiments; however, it should be understood by those skilled in the art that those embodiments are intended to depict the present invention only and should not be interpreted as limiting the scope of the present invention. It should be noted that any variations or alternatives equivalent to the embodiments should be included in the scope of the present invention. Therefore, the scope of the present invention should be defined by the claims of the present application.

What is claimed is:

1. A light-emitting diode current-steering device for enhancing light extraction efficiency of a light-emitting diode and improving current-steering, comprising:

a contact electrode;

a substrate connected to the contact electrode;

a first electrode connected to the substrate;

a first semiconductor layer electrically connected to the first electrode;

a light-emitting layer electrically connected to the first semiconductor layer;

a second semiconductor layer electrically connected to the light-emitting layer;

a second electrode having a main electrode and a plurality of extension electrodes; and a current-steering layer disposed between one side of the second semiconductor layer and one side of the second electrode, the current-steering layer having a main semiconductor layer and an etched region formed by etching the current-steering layer such that the current-steering layer directly below the main electrode is completely removed, thereby increasing electrical resistance below the main electrode so that current flows in a direction toward the main semiconductor layer to achieve a steering effect.

2. The light-emitting diode current-steering device of claim 1, wherein the contact electrode is composed of a combination of titanium/gold or nickel/gold.

3. The light-emitting diode current-steering device of claim 1, wherein the first semiconductor layer is a P-type epitaxial layer or an N-type epitaxial layer.

4. The light-emitting diode current-steering device of claim 1, wherein the second semiconductor layer is a P-type epitaxial layer or an N-type epitaxial layer.

5. The light-emitting diode current-steering device of claim 1, wherein a roughening process is performed on the main semiconductor layer to improve the light extraction efficiency.

6. The light-emitting diode current-steering device of claim 1, wherein the main semiconductor layer is a P-type epitaxial layer or an N-type epitaxial layer and has a thickness thinner than other semiconductor layers.

7. The light-emitting diode current-steering device of claim 1, wherein a transparent electrode is further included between the first electrode and the substrate, and the transparent electrode is a conductive oxide.

8. The light-emitting diode current-steering device of claim 7, wherein a metal layer is optionally included between the first electrode and the substrate and is disposed on one side of the transparent electrode, and the metal layer is composed of titanium, gold, nickel or platinum.

9. The light-emitting diode current-steering device of claim 1, wherein the second electrode is composed of germanium, titanium, nickel, platinum, gold or chromium.

10. The light-emitting diode current-steering device of claim 1, wherein the main electrode and the extension electrodes are used as a reference for the etched region to determine a position of the etched region.

11. The light-emitting diode current-steering device of claim 10, wherein when the main electrode and the extension electrodes are used as the reference for the position of the etched region, the current-steering layer corresponding to a connection position between the main electrode and the extension electrodes is not etched to form the etched region, thereby achieving an improved steering effect.

* * * * *